(12) United States Patent
Ohshima et al.

(10) Patent No.: US 6,397,459 B2
(45) Date of Patent: *Jun. 4, 2002

(54) PRINTED WIRING BOARD WITH MOUNTED CIRCUIT ELEMENTS USING A TERMINAL DENSITY CONVERSION BOARD

(75) Inventors: Osamu Ohshima, Kashiwa; Yoshiaki Udagawa, Tokyo; Masahiro Suzuki; Takeshi Nishiyama, both of Kawasaki, all of (JP)

(73) Assignee: Fujitsu, Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/274,957

(22) Filed: Mar. 23, 1999

Related U.S. Application Data

(62) Division of application No. 09/040,393, filed on Mar. 18, 1998, now Pat. No. 5,936,843.

(30) Foreign Application Priority Data

Oct. 14, 1997 (JP) ............................................. 9-280929

(51) Int. Cl.[7] ................................................. A05K 3/30

(52) U.S. Cl. .............................. 29/832; 29/830; 29/840; 29/874; 29/876

(58) Field of Search ......................... 29/832, 840, 879, 29/882, 884, 845, 830

(56) References Cited

U.S. PATENT DOCUMENTS

| | | | | |
|---|---|---|---|---|
| 4,793,814 A | * | 12/1988 | Zifcak et al. | |
| 4,922,376 A | * | 5/1990 | Pommer | |
| 4,998,885 A | * | 3/1991 | Beaman | |
| 5,806,181 A | * | 9/1998 | Khandros et al. | |
| 5,917,707 A | * | 6/1999 | Khandros et al. | |

* cited by examiner

Primary Examiner—Carl J. Arbes
(74) Attorney, Agent, or Firm—Armstrong, Westerman & Hattori, LLP

(57) ABSTRACT

A method and apparatus are provided for mounting circuit elements on a printed wiring board, wherein an integrated circuit having terminals with a first interterminal pitch are mounted onto a first surface of a terminal density. conversion board which converts the first interterminal pitch of the integrated circuit to terminals with a second interterminal pitch larger than the first interterminal pitch on a second surface of the terminal density conversion board; and the terminals on the second surface of the terminal density conversion board with the second interterminal pitch are mounted onto the printed wiring board.

4 Claims, 9 Drawing Sheets

PRINTED WIRING BOARD WITH MOUNTED CIRCUIT ELEMENTS USING A TERMINAL DENSITY CONVERSION BOARD

This application is a Division of prior application Ser. No. 09/040,393 filed Mar. 18, 1998 U.S. Pat. No. 5,936,843.

BACKGROUND OF THE INVENTION

1. Field of the Invention

The present invention is related to a method and apparatus for mounting a plurality of circuit elements such as integrated circuits and memory elements on a printed wiring board. In particular, the present invention is directed to a terminal density conversion board and connection structures for integrated circuits mounted on the printed wiring board.

2. Description of the Related Art

In recent years, high-speed, low-cost multi-chip modules (MCM) having a plurality of integrated circuit parts mounted on high-density printed wiring boards have become the subject of industrial attention. These multi-chip modules are classified roughly into three types: MCM-L, MCM-C, and MCM-D. The MCM-L type mounts circuit elements on a printed wiring board allowing reductions in production costs. The MCM-C type mounts circuit elements on a thick-film multi-layer ceramic board achieving a moderately high speed at a low cost. The MCM-D type module has circuit elements installed on a circuit board having laminated dielectric and conductive wiring layers on a thick-film substrate such as a ceramic board.

These multi-chip modules are mounted on printed wiring boards (also referred to as circuit boards) together with other circuit elements, which may include active elements such as LSI chips, resistors, and capacitors.

Mounted parts, such as the multi-chip modules and the other circuit elements, have many terminals. The pitches or distances between the terminals of these mounted parts are fixed values. The terminals of these mounted parts are connected to the terminals formed on a printed wiring board. The terminals on the printed wiring board are connected with the multi-layer wiring inside the printed wiring board.

The speed and performance of circuit elements, such as multi-chip modules, mounted on printed wiring boards can be rapidly increased, as compared with other mounted parts, resulting in a radical miniaturization and proliferation of terminals. Naturally, reducing the size of the interterminal pitch on such circuit elements has thus become necessary. Correspondingly, for printed wiring boards on which such mounted parts are mounted, the reduction of the interterminal pitch length is deemed to be inevitable. That is, the interlayer connecting vias formed on a baseboard must be very dense (i.e., tightly packed together) to be used for printed wiring boards for such increasingly faster and improved multi-chip modules.

The printed wiring board is generally a large baseboard, because many circuit elements are mounted thereon. It is extremely difficult to install the highly dense vias over the total area of the baseboard uniformly and flawlessly. Therefore, the yield for this kind of printed wiring board is lower than that of boards forming lower density vias, and this increases the production cost of the overall structure including the mounting parts (such as multi-chip modules) and printed wiring boards on which these mounting parts are mounted.

SUMMARY OF THE INVENTION

It is an object of the present invention to solve the above-described problems in the art.

It is another object of the present invention to obviate the need to increase the via density of the printed wiring board in order to accommodate increasingly faster and improved integrated circuit parts with a higher-density terminal pitch.

It is yet another object of the present invention to improve the product yield and reduce production costs for printed circuit boards mounted with many circuit parts.

It is a further object of the present invention to reduce the cost of materials, increase product yield, and otherwise facilitate the proper miniaturization and improvement of integrated circuit parts having higher-density terminal pitches.

It is also an object of the present invention to reduce the costs for and improve the degree of freedom in design of a single baseboard configuration having a large number of different types of mounted integrated circuits and complex printed wiring distributions.

It is another object of the present invention to ease repairs, re-patterning, replacement, upgrading, and troubleshooting of the printed wiring board and the integrated circuits mounted thereon.

It is a further object of the present invention to more effectively utilize free space on a density conversion board to improve mountability of electrical parts onto the printed wiring board.

It is also an object of the present invention to reduce thermal stress between the integrated circuit and the printed wiring board.

Objects of the present invention are achieved by providing a method and apparatus for mounting circuit elements on a printed wiring board, wherein an integrated circuit having terminals with a first interterminal pitch are mounted onto a first surface of a terminal density conversion board which converts the first interterminal pitch of the integrated circuit to terminals with a second interterminal pitch larger than the first interterminal pitch on a second surface of the terminal density conversion board; and the terminals on the second surface of the terminal density conversion board with the second interterminal pitch are mounted onto the printed wiring board.

Objects of the present invention are also achieved by mounting circuit elements having terminals with the second interterminal pitch onto the printed wiring board at locations other than the location at which the terminal density conversion board is mounted onto the printed wiring board. Alternatively, circuit elements having terminals with the second interterminal pitch may also be mounted onto the terminal density conversion board at locations other than the location at which the integrated circuit is mounted onto the terminal density conversion board and at locations other than the location of the terminals on the terminal density conversion board connecting the terminal density conversion board to the printed wiring board.

Objects of the present invention are further achieved by using different connections between the terminal density conversion board and the printed wiring board, including a soldered metal, pin joints, Z-shaped contacts on which conductive pads on the terminal density conversion board are press-fitted, and a land grid array securing the terminal density conversion board on the printed wiring board.

Objects of the present invention are also achieved by providing a cooling device mounted onto a surface of the integrated circuit (i.e., the surface without the terminals connected to the terminal density conversion board), and setting a thermal expansion coefficient of the terminal density conversion board to a value between a thermal expansion coefficient of the integrated circuit and a thermal expansion coefficient of the printed wiring board.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
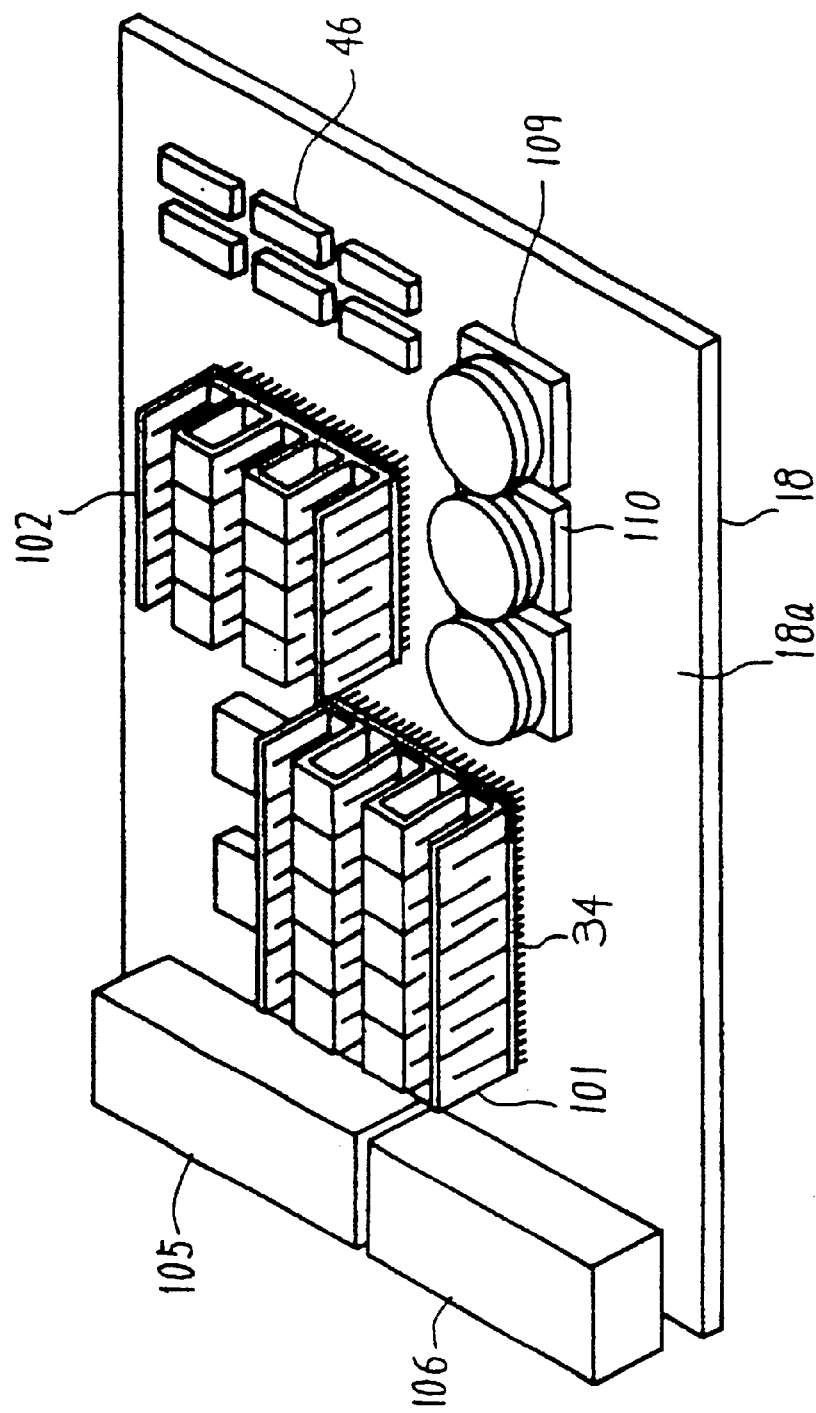
FIG. 1 depicts a printed wiring board with multi-chip modules and other circuit elements mounted thereon.

Reference will now be made in detail to the preferred embodiments of the present invention, examples of which are illustrated in the accompanying drawings FIGS. 1 to 9, wherein like reference numerals refer to like elements throughout.

FIG. 1 is a diagram showing a configuration of a printed wiring board to which the present invention may be applied. In FIG. 1, multi-chip modules 101 and 102, memory elements 46, connectors 105 and 106, and CPU packages 109 and 110 are mounted on a parts-mounting surface 18a of the printed wiring board 18. Furthermore, many capacitors not shown in the figure may be installed between the memory elements 46 on the parts-mounting surface 18a. These multi-chip modules 101 and 102, memory elements 46, connectors 105 and 106, CPU packages 109 and 110, and capacitors (not shown) are referred to as mounted parts. The printed wiring board 18 is a multi-layered wiring board. The printed wiring board 18 is provided with many terminals on the parts-mounting surface 18a. These terminals are formed at the intervals of a first interterminal pitch, which will be described later, on the parts-mounting surface 18a of the printed wiring board 18. These terminals are linked to terminals of the mounted parts. The terminals on the parts-mounting surface 18a are formed using vias, such as interlayer vias. The terminals of the mounted parts are connected to multi-layer wiring inside the printed wiring board through the vias. In FIG. 1, a terminal density conversion board (which will be discussed later) is omitted.

Figure 2:
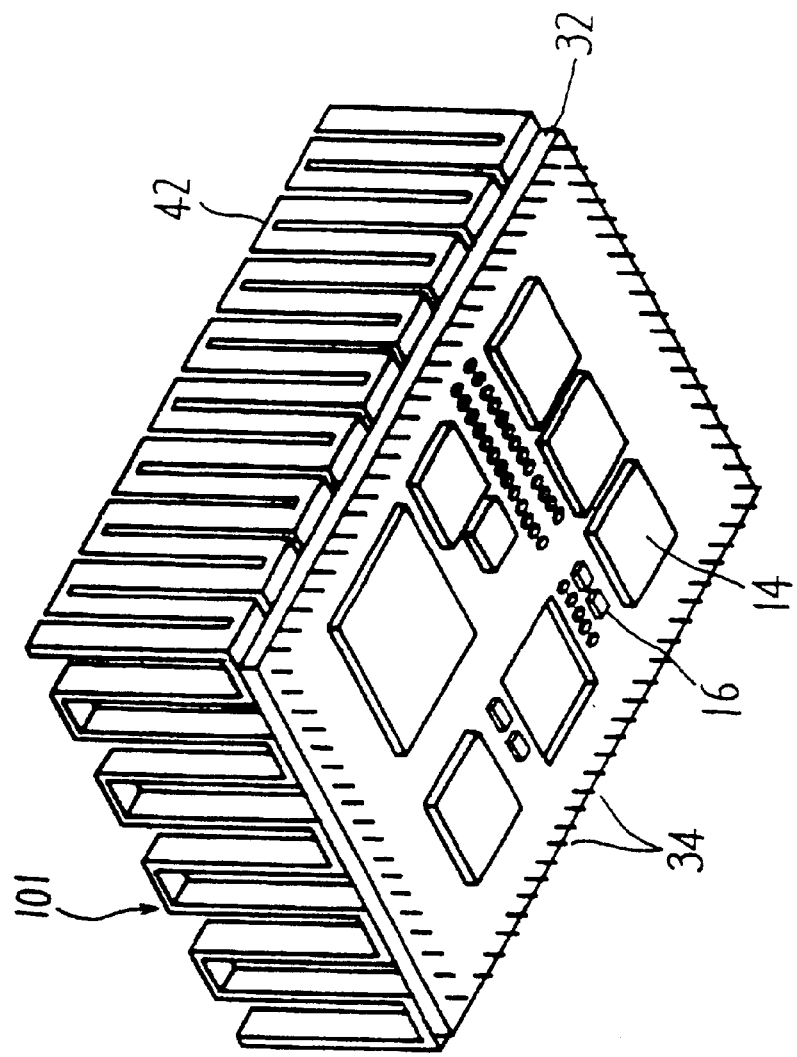
FIG. 2 depicts a perspective view of a multi-chip module.

FIG. 2 is a diagram of a perspective view showing a structure of the multi-chip module 101. In FIG. 2, I/O pins 34 are arranged on the periphery of the thin-film multi-layer circuit board 32 surrounding integrated circuit parts 14 and active elements 16, such as resistors and capacitors. For convenience, the I/O pins 34 are roughly illustrated. At the opposite surface (rear surface) of a baseboard 30 (see, FIG. 3) on which the thin-film multi-layer circuit board 32 is formed, a fin-type heatsink 42 for cooling is installed over the whole surface of the baseboard 30. A pipe (not shown) may be included inside the heatsink 42 to circulate cooling water.

Figure 3:
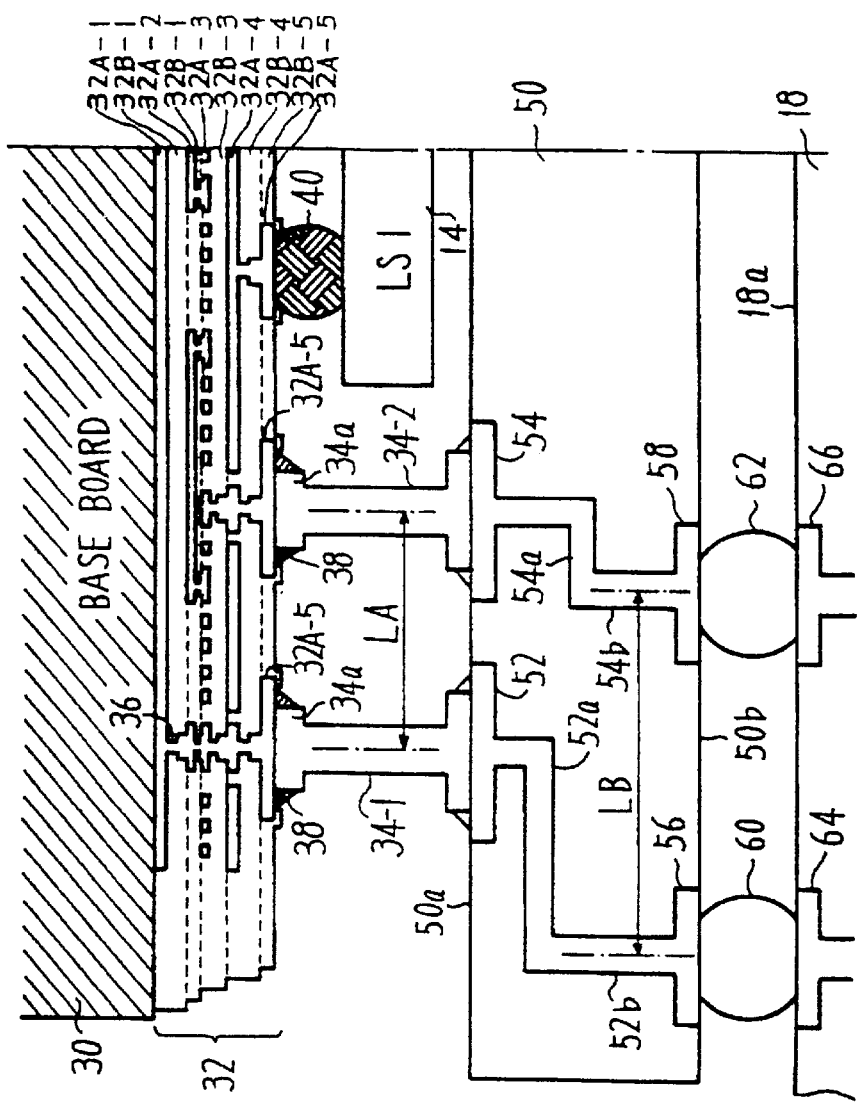
FIG. 3 depicts a preferred embodiment of the multi-chip module and printed wiring board connection using a terminal density conversion board according to the present invention.

FIG. 3 is a diagram showing a configuration of connections between the multi-chip module 101 of the PGA (pin grid array) type shown in FIG. 2 and the printed wiring board 18, using a terminal density conversion board 50 according to the present invention. As mentioned above, the thin-film multi-layer circuit board 32 is formed on the baseboard 30 of the multi-chip module 101. This thin-film multi-layer circuit board 32 is composed of multi-layer elements. In more detail, the thin-film multi-layer circuit board 32 has first wiring conductors 32A-1, second wiring conductors 32A-2, third wiring conductors 32A-3, fourth wiring conductors 32A-4, fifth wiring conductors 32A-5, a first dielectric layer 32B-1, a second dielectric layer 32B-2, a third dielectric layer 32B-3, a fourth dielectric layer 32B-4, and a fifth dielectric layer 32B-5. These wiring conductors and dielectric layers are laminated under the baseboard 30 in the order shown in FIG. 3. The thin-film multi-layer circuit board 32 is formed using an ordinary thin-film LSI manufacturing process (i.e., a thin-film forming process).

The wiring conductors 32A-5 form pads used to attach the I/O pins 34 (e.g., 34-1 and 34-2 shown in FIG. 3) and the integrated circuit parts 14. The pads 32A-5 to which the I/O pins 34 are attached are arranged in an array. The wiring conductors 32A-1 or 32A-4 extend lengthwise and crosswise within the thin-film multi-layer circuit board 32. The wiring conductors embedded in different layers are connected to each other via holes formed in the dielectric layers lying between the wiring conductors. For instance, the wiring conductors 32A-1 are connected to the wiring conductors 32A-2 through holes 36 formed in the dielectric layer 32B-1. In addition, the wiring conductors 32A-1 form, for example, a power supply layer.

Mounting surfaces of the pads 32A-5 are exposed through the dielectric layer 32B-5. Joining portions 34a of the I/O pins 34 are fixed to the pads 32A-5 of the multi-layer board 32 by a solder 38. The area of the exposed pad 32A-5 is greater than the joining portion 34a of the I/O pin 34. In the configuration shown in FIG. 3, the wiring conductors 32A-1 (which constitute the power supply layer) are connected to the I/O pins 34 through the, via holes. The I/O pins 34 are fixed by using well-known soldering techniques.

The I/O pins 34 (e.g., 34-1 and 34-2 shown in FIG. 3) are terminals to be connected to another board. The distance between the I/O pin 34-1 and the I/O pin 34-2 is referred to as an interterminal pitch. The value of the interterminal pitch is depicted as the distance LA. The distance between the I/O pin 34-2 and a soldering bump 40 is also LA. This means that the arranged pitch of the pads 32A-5 in the thin-film multi-layer circuit board 32 is equal to the distance LA.

FIG. 3 also shows one of the integrated circuit parts 14 attached to the pad 32A-5 through the soldering bump 40. Instead of the bump 40, a wire bonding or a TAB (tape automated bonding) lead may be used.

The materials in the respective parts of the multi-chip modules will now be explained. The baseboard 30 may be made of a ceramic such as AIN, AIS 2S OS 3S, and Mulite; metals of alloy of Al, Cu, Cu-W, etc.; Si; or glass. Furthermore, the baseboard 30 can be formed using resins such as dielectric resins generally used for printed wiring boards, for example, glass epoxy, and glass polyimide.

The dielectric layers 32B-1 to 32B-5 of the thin-film multi-layer circuit board 32 are formed from organic materials such as polyimide, Teflon, and epoxy. For the wiring conductors 32A-1 to 32A-5, Al, Cu. etc. may be used.

The configuration of the thin-film multi-layer circuit board 32 is not necessarily confined to the example shown above, and therefore any number of wiring conductor layers may be laminated with intermediate dielectric layers as required.

The I/O pins 34 are installed onto the printed circuit board 18 through the terminal density conversion board 50. The terminal density conversion board 50 is a multi-layer wiring board. The terminal density conversion board 50 is equipped with pads 52 and 54 on which the I/O pins 34-1 and 34-2 are respectively connected, such as by soldering. The connection of both can be joined by a bump in lieu of the I/O pin. The pads 52 and 54 are formed on the first surface 50a of the terminal density conversion board 50. Although only two of the pads are shown in FIG. 3, a number of pads are installed in a gridiron pattern on the first surface 50a. The pitch between the pads arranged in the gridiron pattern is equal to the distance LA.

The pad 52 is connected to a pad 56 formed on the other surface 50b of the density conversion board 50 via multi-layer wiring 52a and 52b. The pad 54 is connected to a pad 58 formed on the surface 50b of the density conversion board 50 through a multi-layer wiring 54a and 54b. The wiring 52a and the wiring 54a are formed on different wiring layers. The wirings 52a and 52b are connected to the pads 52 and 56 via through holes. The wirings 54a and 54b are connected to the pads 54 and 58 via through-holes. The distance between the wiring 52b and the wiring 54b is the distance LB. The distance LB is, for example, 1.5 times the distance LA. The relationship between both varies whenever the distance LA is changed. The terminal density conversion board 50, so prescribed, can be fabricated easily by using well-known methods of manufacturing printed wiring boards.

Although only the pads 56 and 58 are shown in FIG. 3, many pads are arranged in a gridiron pattern on the surface 50b. The pitch of the pad arrangement on the surface 50b is equal to the distance LB.

The pads on the surface 50b are connected to the printed wiring board 18 via bumps. In FIG. 3, the pad 56 is connected to a pad 64 provided on the surface 18a of the printed wiring board 18 by a bump 60. The pad 58, on the other hand, is connected to a pad 66 via a bump 62. Solder or gold may be used for bumps 40, 60, and 62. The interpad pitch between the pads on the surface 18a of the printed circuit board 18 is the distance LB. The plurality of pads on the printed circuit board 18 are formed on the surface 18a in a gridiron pattern with a grid pitch of LB.

The terminal density conversion board 50 converts the terminal density LA to the terminal density LB. Before doing the conversion of terminal density, the terminal density relationship between the pads on the surface 50a and the pads on the surface 50b are predetermined according to the relationship between the I/O pins 34 on the side of the multi-chip module 101 and the pads on the printed wiring board 18. The terminal density conversion board 50 is fabricated, according to a predetermined correlation, by using the known production processes for printed wiring boards.

Figure 4:
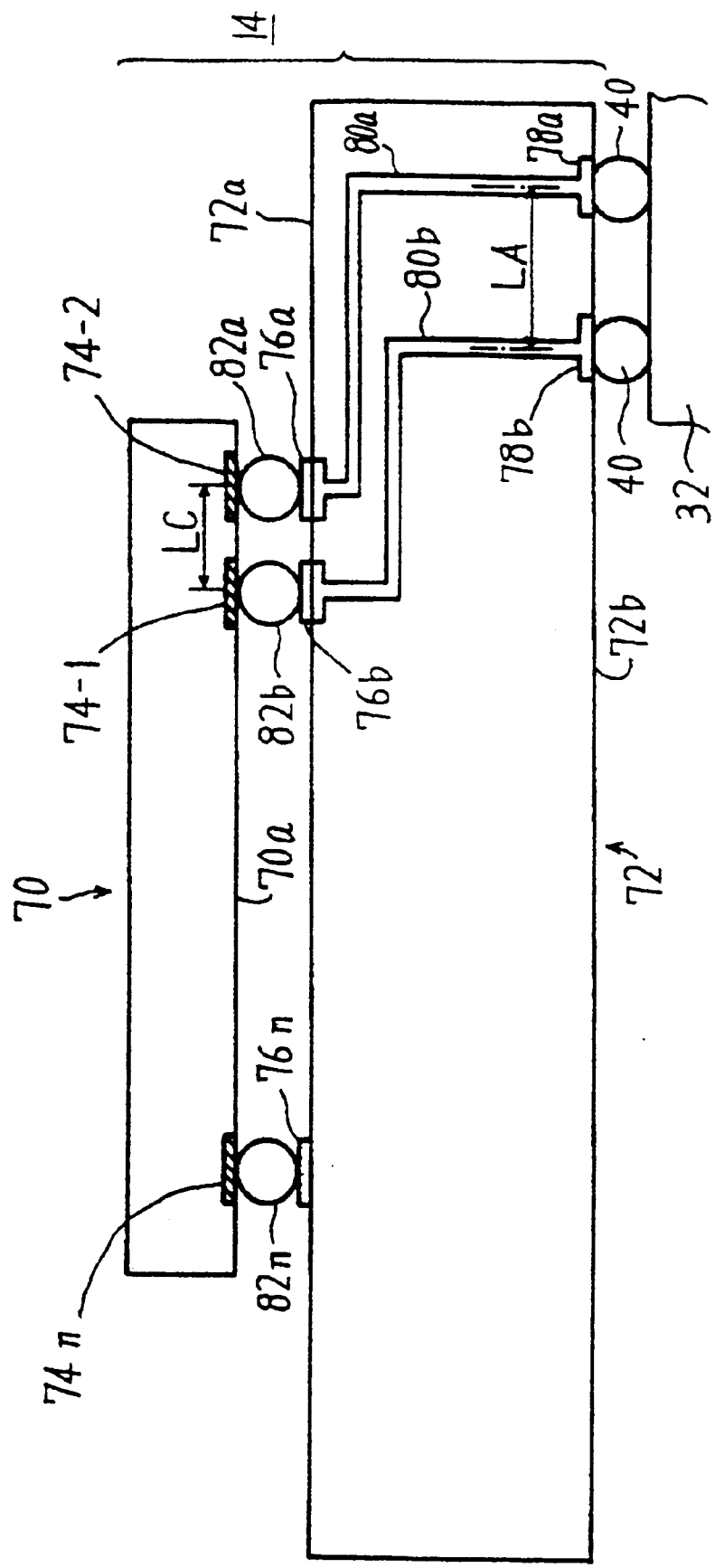
FIG. 4 depicts an integrated circuit part of the multi-chip module.

FIG. 4 is a diagram showing the detailed construction of one of the integrated circuit parts 14 provided in the multi-chip module 101, although in a reversed view as compared with FIGS. 2 and 3. In other words, the thin-film multi-layer circuit board 32 to which the integrated circuit parts 14 are connected is shown on the bottom of FIG. 4 (in contrast to FIGS. 2 and 3).

The integrated circuit part 14 comprises a LSI chip 70 and a thin-film multi-layer board 72. The LSI chip 70 is a bare chip. As is generally known, the bare chip 70 is a chip before being installed into a package. Pads 74 (i.e., 74-1, 74-2 to 74-n) are formed on the surface 70a of the bare chip 70 with a prescribed pitch. The pads 74 of the bare chip 70 are arranged at intervals of the distance LC. The terminal density is defined as the distance LC.

The thin-film multi-layer board 72 is a baseboard which is most frequently used when installing an LSI such as the bare chip 70. A ball grid array board can be used as the thin-film multi-layer board 72. The thin-film multi-layer board 72 is a board used to perform the density conversion function in a similar manner as the terminal density conversion board 50.

The surface 72a of the thin-film multi-layer board 72 is provided with pads 76 (i.e., 76a, 76b to 76n) formed in a gridiron pitch of LC. The opposing surface 72b of the thin-film multi-layer board 72 is provided with pads 78 (e.g., 78a and 78b). The pads 76 on the surface 72a of the thin-film multi-layer board 72 are connected to the pads 78 on the opposing surface 72b via respective multi-layer wiring 80 (e.g., 80a and 80b). The multi-layer wiring 80 is manufactured by known production techniques for forming thin-film layers as in the case of the terminal density conversion board 50. Each of the pads 76 and 78 are connected to each other in a one-to-one correspondence. The thin-film multi-layer board 72 converts the pitch arrangement from the distance LC on the surface 72a to the distance LA on the opposing surface 72b. The distance LA is, for example, 1.5 times the distance LC.

The bare chip 70 and the thin-film multi-layer board 72 are linked via bumps 82 (i.e., 82a, 82b to 82n). A bump 82a joins a pad 74-2 with a pad 76a. A bump 82b joins a pad 74-1 with a pad 76b. A bump 82n joins a pad 74-n with a pad 76n. The remaining pads (not shown) formed on the surface 70a of the bare chip 70 are connected to respective bumps (not shown). A method of mounting the bare chip 70 onto the thin-film multi-layer board 72 has been explained in, for example, Japanese Laid Open Patent Application Nos. Tokkai-Hei 5-315395 and Tokkai-Hei 5-67639.

Furthermore, the integrated circuit parts 14 are linked to the thin-film multi-layer board 32 of the multi-chip module 101. The connection is established by using bumps in the same manner as in the connection of the bare chip 70 and the thin-film multilayer board 72. The bumps 40 (shown in FIGS. 3 and 4) join the pads 78 of thin-film multi-layer boards 72 to the pads 32A-5 of the thin-film multi-layer circuit board 32. A method of joining via bumps is disclosed in U.S. Pat. No. 4,661,192.

The multi-chip module 101 having I/O pins 34 arranged at the pitch of LA is mounted on the printed wiring board 18 via the terminal density conversion board 50, as described above. In addition, the circuit parts other than the multi-chip modules 101 and 102, i.e., the memory elements 46, the connectors 105 and 106, the CPU packages 109 and 110, and the capacitors (not shown), are also provided with a plurality of terminals. These other circuit parts are also secured to the printed wiring board 18 through the plurality of terminals. In this embodiment, the interterminal pitch of the respective circuit parts are defined to be the distance LA, except for the terminal pitches of the connectors 105 and 106.

The terminal pitches of the connectors 105 and 106 may be greater than those of other circuit parts. In such a case, only the area of the printed wiring board 18 at which the connectors 105 and 106 are mounted are consequently formed with a grid pitch greater than in other locations at which the other circuit parts are mounted, in accordance with the terminal pitch of the connectors 105 and 106.

As with the multi-chip module 101, the multi-chip module 102 is also equipped with the terminal density conversion board 50. Thus, the terminal pitch of each of the circuit elements (except the connectors 105 and 106) to be mounted on the printed wiring board 18 can be made uniform for mounting. Consequently, the grid pitch for the majority of the printed circuit board 18 can be fixed to a single grid pitch. In other words, the majority of the printed wiring board 18 can be fashioned to form pads or vias with a grid pitch of LA to accommodate the substantially consistent interterminal pitch LA of the circuit parts mounted thereon.

In particular, there is no need for a narrower terminal pitch on the printed wiring board 18 even if multi-chip modules having terminal pitches narrower than that of other circuit parts are incorporated into the design. With the use of the terminal density conversion board 50, the printed wiring board 18 does not need to have high-density vias to accommodate the otherwise narrower and denser terminal pitches of the multi-chip modules. In other words, there is no need to increase the via density of the printed wiring board to accommodate increasingly faster and improved integrated circuit parts with higher density terminals (of which the multi-chip modules 101 and 102 are just examples). Therefore, fabrication with a broader pitch standard for the printed wiring board is possible. And, the printed circuit board need not be equipped with built-up layers to accommodate the higher density terminal pitch of the integrated circuits. Accordingly, manufacture of the printed wiring board (which is a multi-layer resin baseboard) will not suffer a reduced product yield and there will be no significant increase in the overall production cost for printed circuit boards mounted with many circuit parts.

Moreover, the terminal density conversion board 50 is a separate board, practically independent of the printed wiring board. This separate board handles the terminal processing for the integrated circuit parts mounted on the printed wiring board. Since the separate board connects the terminals of the integrated circuit parts to the printed wiring board indirectly, requirements for a smaller dimensional order of the integrated circuit parts can be better met by the separate board instead of modifying the printed wiring board.

In general, density enhancement in terms of terminal processing within a printed wiring board is difficult. Thus, it is normally necessary to conform the terminal density of integrated circuit parts to the terminal density of the printed wiring board when the integrated circuit parts are directly mounted onto the printed wiring board. Therefore, even if the miniaturization and integration of integrated circuit parts rapidly improves, true miniaturization is prevented by the terminal density of integrated circuit parts needing to conform to the terminal density achievable on the printed wiring board.

However, the terminal density conversion board 50 realizes about one and a half times reduction of the terminal pitch, so the area of integrated circuit parts can be reduced by a quarter. Of course, while the use of the separate terminal density conversion board only partially improves the terminal processing density of the printed circuit board, this technique is nevertheless more advantageous than the density enhancement of printed circuit boards as a whole, so far as productivity, yield, and economy are concerned. For example, if the product yield when developing built-up layers that include high-density vias on a printed circuit board having an area of 30×30 cm is 1%, this corresponds to a 60% product yield in the case of a separate board having an area of 10×10 cm. Therefore, by using a structure with a density conversion circuit (such as the terminal density conversion board 50), the miniaturization of integrated circuit parts will be properly realized, the cost of materials reduced, and the product yield increased.

Furthermore, in a board configuration in which a system or subsystem function of an electronic appliance is achieved in a single board configuration, a large numbers of different types of integrated circuits must be mounted. Also, the terminal density of such diversified integrated circuit parts might not be simple. In such a case, the so-called degree of freedom in design could be improved by a structure having the separate board selectively intervening in the areas of the single printed wiring board at locations in which high-density terminal processing is necessary to mount the corresponding integrated circuit parts. Therefore, otherwise expensive system baseboard configurations requiring extensive printed wiring distributions is made much more realizable with much less expense.

In addition, because the density conversion board and the printed wiring board are separate, wiring redistribution or pattern-cuts in the connection areas are practical on the printed wiring boards and/or on the density conversion boards. The interchange of parts and components is also simplified since the terminal density conversion board 50 and the printed wiring board 18 are connected with the bump connections. Thus, when a problem occurs in a printed wiring board or a density conversion board, the defective part alone can be replaced with a non-defective part. There is no need to scrap the entire printed wiring board and it is possible to easily reconstruct and repair boards.

If modification of the integrated circuit parts mounted on a density conversion board is required due to a version upgrade, etc., the modification can be performed only on the affected part of the density conversion board. Therefore, a printed wiring board can be redesigned with a high degree of flexibility.

Figure 5:
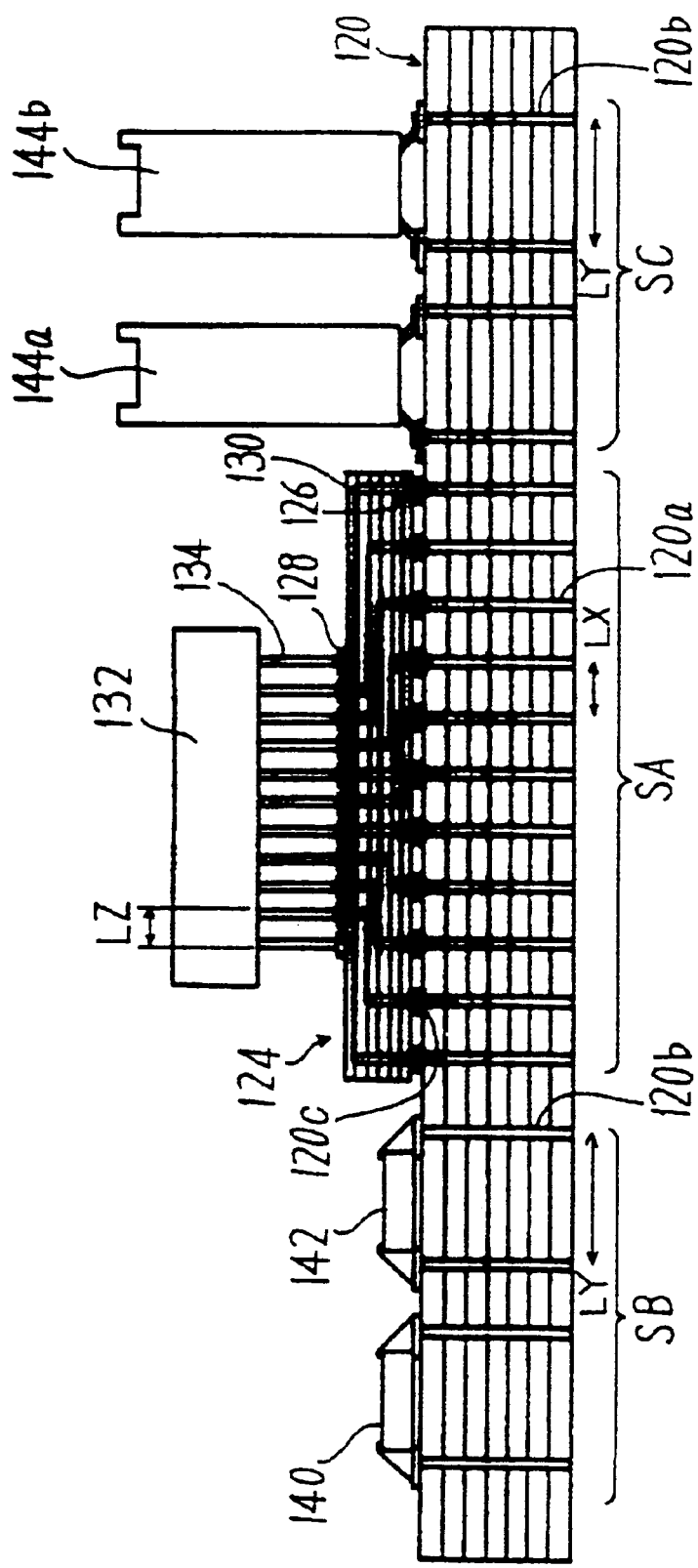
FIG. 5 depicts a preferred embodiment of the multi-chip module and printed circuit board connection layout using the terminal density conversion board according to the present invention.

While a preferred embodiment of the present invention was described above, the present invention is not limited to the above embodiment. Other configurations are also possible. As shown in FIG. 5, a printed wiring board 120 is a multi-layer wiring board. The printed wiring board 120 has an area SA where through holes 120a are formed at a pitch of LX and areas SB and SC where through holes 120b are formed at a pitch of LY. A density conversion board 124 is mounted onto the area SA of the printed wiring board 120. The density conversion board 124 is a multi-layer wiring board having a configuration similar to that of the terminal density conversion board 50 mentioned before. Eleven pads 126 having a pitch of LX are provided on the lower surface of the board 124 (as depicted in FIG. 5). The pads 126 are connected to pads 120c formed on the upper surface of the printed wiring board 120. The method of joining the density conversion board to the printed wiring board is the bump connection method previously mentioned.

The upper surface of the board 124 is provided with pads 128 having a pitch equal to LZ. There are eleven of these pads 128. Each pad 128 is connected to the corresponding pad 126 via a multi-layer wiring 130. The board 124 is provided independently from the printed board 120, as is with the terminal density conversion board 50.

A high-density terminal integrated circuit part 132 is mounted on the density conversion board 124. This integrated circuit part 132 is provided with I/O pins 134 which are high-density terminals. Eleven I/O pins 134 are soldered to each of the pads 128 formed on the upper surface of the density conversion board 124. The terminal pitch of the I/O pins 134 is identical to LZ. As with the multi-chip module 101, the high-density terminal integrated circuit part 132 is itself fitted with another integrated circuit part (LSI) having a terminal pitch narrower than LZ of the I/O pins 134.

A capacitor 140 and a resistor 142 are mounted in the area SB of the printed wiring board 120. The capacitor 140 and the resistor 142 have terminal pitches equal to LY.

Connectors 144a and 144b are mounted in the area SC of the printed wiring board 120. The connectors 144a and 144b have terminal pitches equal to LY.

The printed wiring board 120 is a circuit board provided with a terminal pitch considerably wider than the terminal pitch of the high-density terminals of the integrated circuit part 132 and the terminal pitch of the integrated circuit parts mounted on the circuit part 132. Therefore, the product yield of the printed wiring board 120 can be brought to the yield level of an ordinary printed wiring board. Since the density conversion board 124 is a sufficiently small-sized printed wiring board, its product density yield can be maintained at the level of the printed wiring board 120.

In addition, in FIG. 5, only one pair of the density conversion board 124 and the integrated circuit part 132 with high-density terminals are shown mounted in the SA area. However, more pairs can be mounted on the printed wiring board 120. For instance, three pairs may be mounted in the printed wiring board 120, in which case, the area SA will be enlarged in proportion to the number of such pairs to be included.

The present invention is also not limited to the bump connection method of combining the printed wiring board 18 with the terminal density conversion board 50 illustrated in the connection layouts shown in FIGS. 1–5. Other connection methods may be used for connecting the terminal density conversion board 50 to the printed wiring board 18. For instance, connections may be made using I/O pins. The connection technique using I/O pins is similar to the method, discussed above, applied to the connection of the thin-film multi-layer board 32 with the terminal density conversion board 50 by using I/O pins. The I/O pins to be connected to the terminal density conversion board 50 and to the. printed wiring board 18 may be set up by the solidification of melted metal or by press-fitting between conductors. Also, the connections between the I/O pins and the printed wiring board 18 can be made by brazing, and the connections between I/O pins and density conversion boards can be made by soldering. The brazing and soldering can be reversed.

Figure 6:
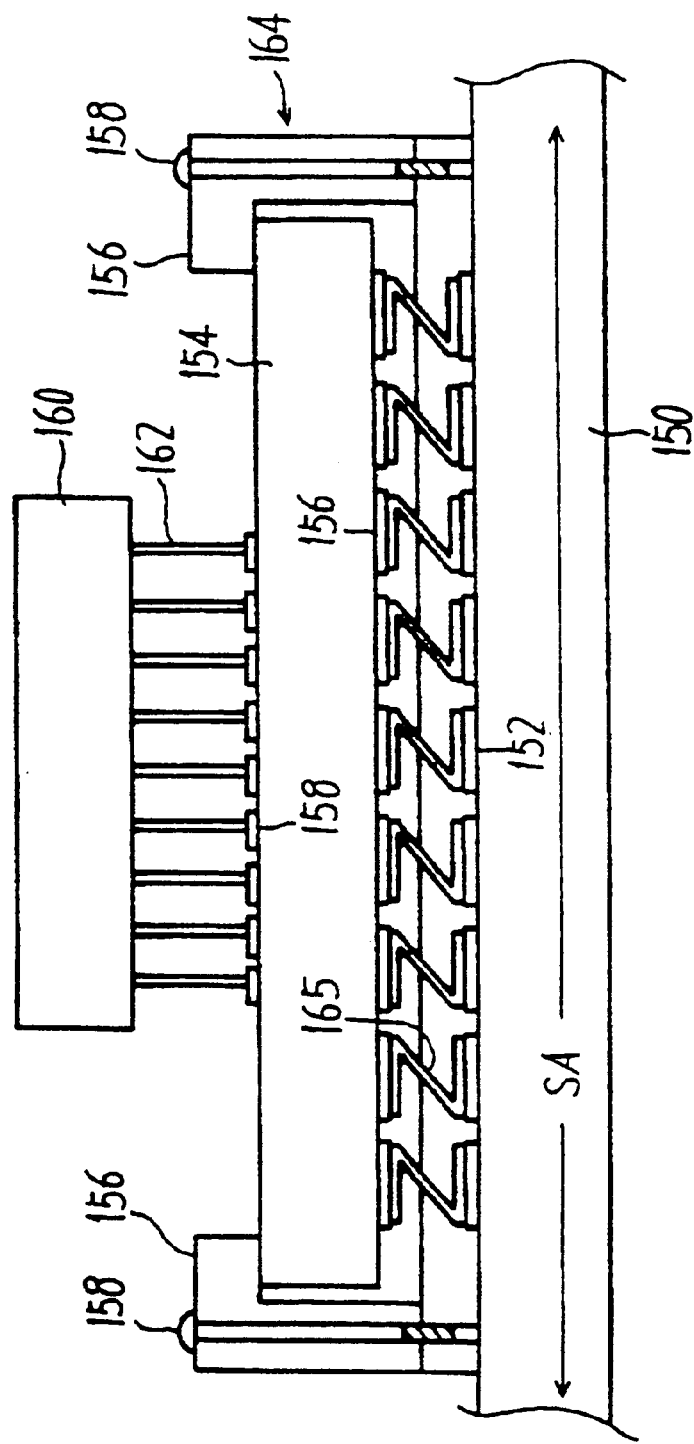
FIG. 6 depicts another preferred embodiment of the multi-chip module and printed wiring board connection package according to the present invention.

FIG. 6 shows another connection package layout between an integrated circuit and the printed wiring board according to the present invention. In FIG. 6, a printed wiring board 150 is a multi-layer wiring board having a structure similar to the printed wiring board 120. The printed wiring board 150 is provided with nine pads 152 connected to through holes on its upper surface not shown in the figure.

A density conversion board 154 is a circuit board having a configuration similar to the density conversion boards 124 and 50. The lower surface of the board 154 has nine pads 156. Another nine pads 158 are arranged on the upper surface of the board 154. The pads 156 and the pads 158 are interconnected via multi-layer wiring (not shown) provided inside the board 154.

An integrated circuit part 160 with high-density terminals is provided with nine I/O pins 162. The pins 162 are fixed to the pads 158 on the board 154 by brazing or soldering. The integrated circuit part 160 with the high-density terminals supports the integrated part 14 shown in FIG. 4. The integrated circuit part 160 with high-density terminals is integrated into the board 154 beforehand.

An LGA (land grid array) connector 164 is attached to an area SA of the printed wiring board 150. Retaining plates 156 are put onto the board 154 after the board 154 is located over the board 150. Next, the retaining plates 156 are fastened to the board 150 by using bolts 158.

The pads 152 on the printed wiring board 150 and the pad 156 on the density conversion board 154 are interconnected via contacts 165 of the LGA connector 164. The LGA connectors can be used as disclosed in Japanese Laid Open Patent Application Nos. Tokkai-Hei 8-78124 and Tokkai-Hei 6-17175. In the connection structure shown in FIG. 6, the contacts 165 assume a Z-shape. Here, the contacts 165 are retained by the connector 164, but not fastened to the board 154. The contacts 165 are compressed when pressed by the retaining plate 156. The recovering force of the contacts 165 constitutes the contact force between the contacts 165 and the pads 156. Accordingly, the density conversion board 154 together with the integrated circuit part 160 can be separated from the baseboard 150 by simply releasing the retaining plates 156.

Figure 7:
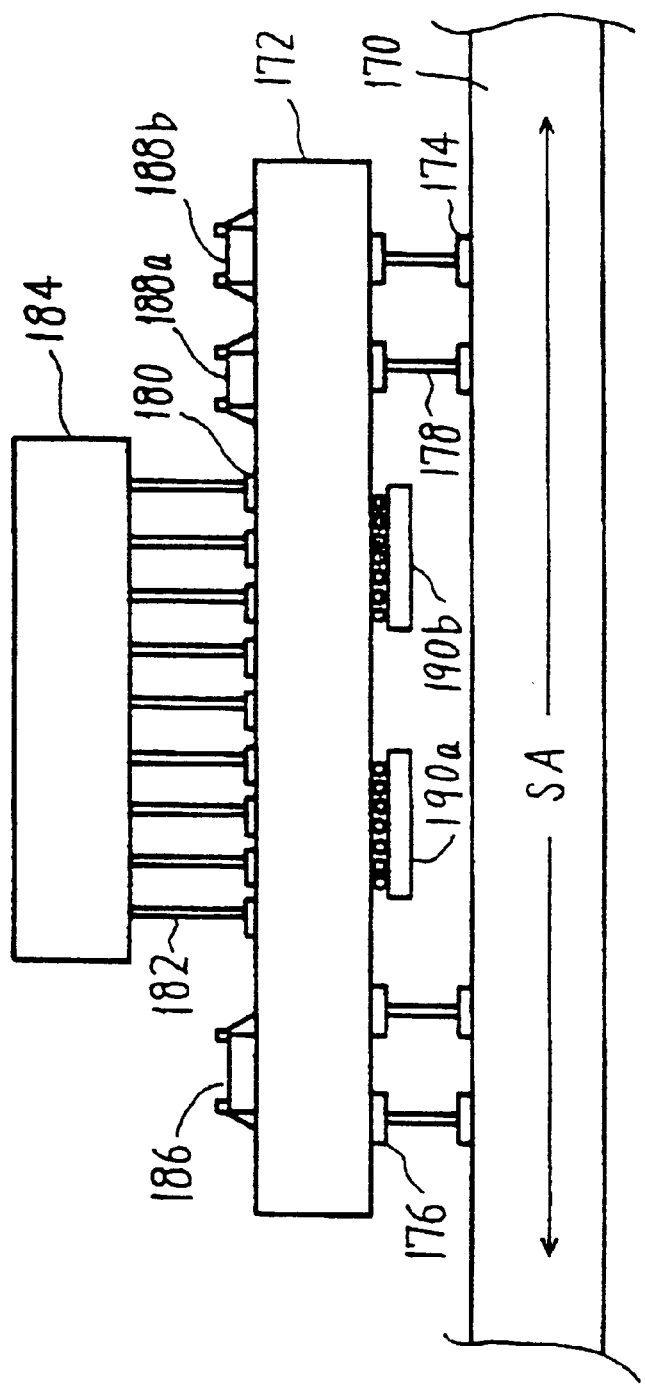
FIG. 7 depicts yet another preferred embodiment of the multi-chip module and printed wiring board connection using the terminal density conversion board according to the present invention.

FIG. 7 illustrates another example of the density conversion board. In FIG. 7, a printed circuit board 170 is a multi-layer wiring board having the same structure as the printed wiring board 120 as shown in FIG. 5. The printed wiring board 170 is mounted with a density conversion board 172 in the area SA, which has a via pitch of LX. On an upper surface of the printed wiring board 170, pads 174 are arranged at a pitch of LX.

The density conversion board 172 is a multi-layer wiring board formed in the similar manner as the density conversion board 50. The lower surface of the density conversion board 172 is provided with pads 176. The pads 176 are arranged at a pitch of LX. The pads 176 are connected to pads 174 by means of I/O pins 178. The board 172 is provided with nine pads 180 on its upper surface. The pads 180 are formed with an arrangement pitch narrower than the pitch of LX. The pads 180 are connected to a high-density terminal integrated circuit part 184 via I/O pins 182. The high-density terminal integrated circuit part 184 further supports an integrated circuit part similar to the integrated circuit part 14 mounted on the multi-chip module 101.

The printed wiring board 172 is equipped with a capacitor 186, resistors 188a and 188b, and other small electric parts on its upper surface (not shown). These small electric parts are fixed to the board 172 through the vias (not shown) arranged at a pitch identical to that of the pads 180.

Furthermore, integrated circuit parts 190a, 190b constructed from bare chips (similar to the bare chip 70 shown in FIG. 4) mounted to the lower surface of the printed density conversion board 172 using a thin-film multi-layer board (similar to 72 shown in FIG. 4). The integrated circuit parts 190a, 190b are connected by means of the bumps.

Although the pitch of these bumps is narrower than that of the pads 180, the printed density conversion board 172 is smaller than the printed wiring board 170. That is, since the area of the printed density conversion board 172 is small, its product yield would not be significantly reduced even if vias are formed on the printed density conversion circuit board 172 with a small pitch capable of mounting the integrated circuit parts 190a, 190b.

The density conversion board 172 has a terminal pitch on its bottom surface identical to the terminal pitch of the printed wiring board 170. Although the high-density terminal integrated circuit part 184 is mounted on the density conversion board 172 with the same number of terminals as on the lower surface of the density conversion board 172, the density conversion board 172 has excessively large surplus areas around the area on which the integrated circuit part is mounted. This surplus area could be used for other integrated circuit parts, capacitors 186, resistors 188a and 188b, and the like. Small electronic parts may also be provided for reducing electrical noise. Also, on the lower surface of the density conversion board 172, there are surplus areas not occupied by the pads 176 that are used by the integrated circuit parts 190a and 190b. As described above, this further embodiment of the present invention illustrates the improvement of mountability of parts.

Figure 8:
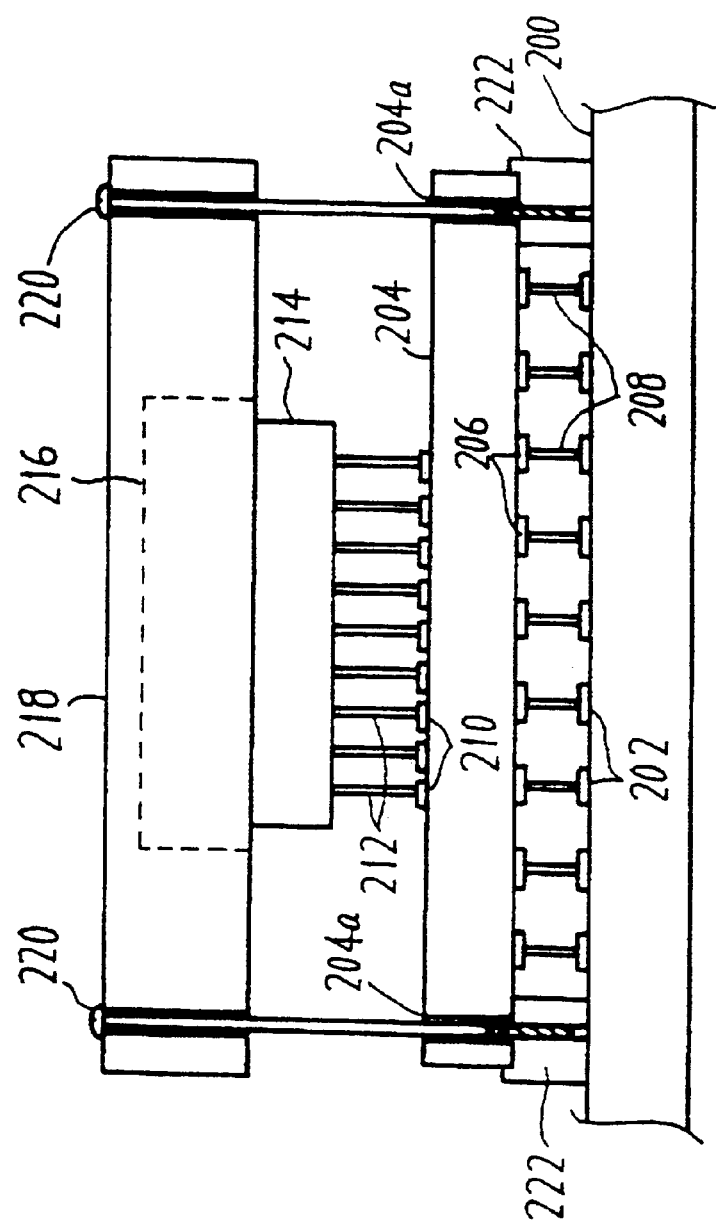
FIG. 8 depicts a further preferred embodiment of the multi-chip module and printed wiring board connection package according to the present invention.

FIG. 8 shows another preferred embodiment of the printed wiring board and multi-chip module connection package according to the present invention. There are nine pads 202 formed on an upper surface of a printed wiring board 200. Nine pads 206 are formed on a lower surface of a printed board 204, which has the same structure as the density conversion boards 50 and 124 mentioned earlier. Both the pads, 202 and the pads 206 are interconnected via I/O pins 208. A high-density terminal integrated circuit part 214 is mounted to the printed board 204 via pads 210 and I/O pins 212. A high-density terminal integrated circuit part 214 has a similar configuration as the high-density terminal integrated circuit parts 184, 160, and 132.

The circuit part 214 is cooled by a cooling part 216. The cooling part 216 is mounted on a holder 218. The holder 218 is fixed to the printed wiring board 200 with screws 220. The screws 220 are engaged through holes 204a of the printed board 204 with a block 222 over the printed wiring board 200. The cooling part 216 and the holder 218 can also be a larger cooling system integrating the cooling part 216 with the holder 218 in order to improve the cooling efficiency.

Figure 9:
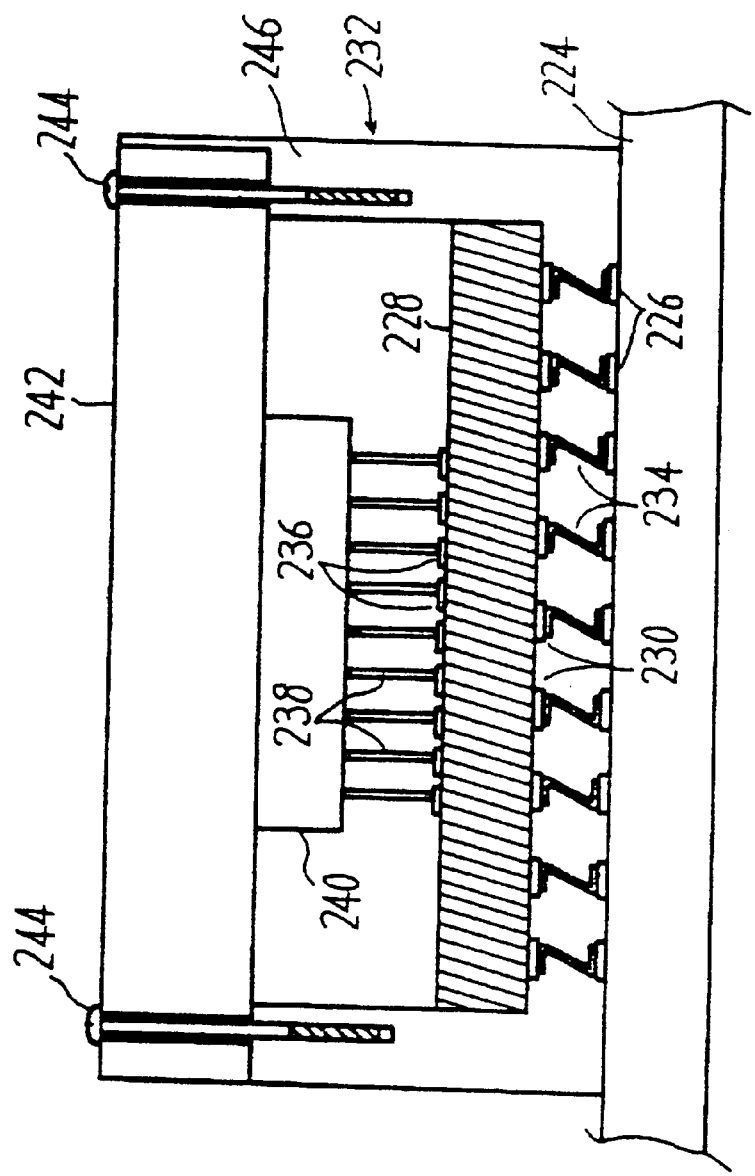
FIG. 9 depicts still another preferred embodiment of the multi-chip module and printed wiring board connection package according to the present invention.

FIG. 9 shows yet another preferred embodiment of the printed wiring board and multi-chip module connection package according to the present invention. In FIG. 9, there are nine pads 226 formed on an upper surface of a printed wired board 224. The nine pads 230 are also formed on a lower surface of the printed board 228, which has the same configuration as the density conversion boards 50 and 124 mentioned before. Both pads 226 and pads 230 are interconnected via contacts 234 of a LGA connector 232. The printed board 228 mounts a high-density terminal integrated circuit part 240 which is connected to the printed board 228 through pads 236 and I/O pins 238. The high-density terminal integrated circuit part 240 has the same construction as the other high-density terminal integrated circuit parts 184, 160, and 132.

The circuit part 240 is cooled by a cooling device not shown in the figure. The cooling device is mounted on a holder 242, similar to that in FIG. 8. The holder 242 is secured to a block 246 of the LGA connector 232, which is fixed on the printed circuit board 224 by using bolts 244.

The installation method applied to the printed wiring boards shown in FIGS. 8 and 9 assumes a flexible configuration to allow for the mounting/dismounting of the cooling device. Maintenance/replacement operations of the cooling device is also facilitated. The cooling device is bolted from the top of the cooling device. An operation of removal of screws is made from the top of the installed board only. Even if the printed wiring board is crowded with parts, access and removal can be done satisfactorily.

The blocks 222/246 are installed between the printed boards 204/228 and the printed wiring board 200/224. The blocks 222/246 can be positioned by using the contour of printed boards 204/228. The blocks 222/246 are locked by the contacting stress/friction of the baseboard furnished by I/O pins etc., and no other retaining means is necessary. The cooling system's binding strength is high enough compared to the direct attachment of integrated circuit parts, because the system is securely fixed by the blocks. Therefore, cooling parts can be enlarged as required.

Moreover, the structural advantage of loading/unloading the printed wiring board 228 can provide a significant flexibility advantage in the case of the installation shown in FIG. 9.

In addition, if there are any differences in the thermal expansion coefficients of the facial directions between the high-density terminal integrated circuit which is a printed board and the multi-layer resin board which is a printed wiring board, a direct mounting of the high-density terminal integrated circuit part onto the multilayer resin board will inevitably cause thermal stress on the soldered connection portions. This stress increases in proportion to the difference of the thermal expansion coefficients. If the stress is significant, the soldered portions can become open circuits due to cracking or other failures. Therefore, the material for the thermal expansion coefficient in a plan direction of a printed board (i.e., the density conversion board) should be carefully selected and determined to have a thermal expansion coefficient between the thermal expansion coefficient of the high-density terminal integrated circuit part and the thermal expansion coefficient of the printed wiring board. For example, it is desirable to select a material of which the difference between the thermal expansion coefficient of the high-density terminal integrated circuit part and the thermal expansion coefficient of the printed wiring board should be less than 10 p.p.m. The setting of the thermal expansion coefficient of each member can be established by blending or adding dielectric materials that have different thermal expansion coefficients to the principal dielectric ingredients of each member. This will make it possible to gradually relieve the thermal stresses and to reduce the generation of thermal stresses following a temperature change, resulting in improved and more reliable electronic conductivity.

Some of the unique structures of the present invention illustrated in the preferred embodiments discussed above will be emphasized below:

(1) An integrated circuit part is connected to a multi-layer resin printed wiring board through a separate terminal density conversion board at only a portion corresponding to the location of the integrated circuit part on the printed wiring board. The printed wiring board (the single baseboard) may also include other parts (such as a connector, a register, a condenser, etc.) mounted thereon.

(2) The connection between the terminal density conversion board and the printed wiring board may be provided by the solidification of melted metal such as a solder or by press-fitting between the conductors, which enables the feasibility of connection and disconnection of the separate density conversion board and the printed wiring board by the liquefaction of the melting metal or due to the presence and release of the press-fitting force of each conductor.

(3) Baseboard connections may also be provided by pin joints in which one end is brazed and the other end is soldered, thus enabling the connection/disconnection of the separate terminal density conversion board and the printed wiring board by melting the soldered portion.

(4) Baseboard connections may also have pads or bumps previously soldered, thus enabling the connection/disconnection of the separate terminal density conversion board and the printed wiring board by melting the soldered portion.

(5) A LGA type connector may be used for the baseboard connections.

(6) A connection package may also allow the thermal expansion coefficient in a plane direction of the density conversion board to be set to the intermediate value between the thermodynamic indicia for the integrated circuit part in a plane direction and a value of the thermal expansion coefficient of the printed wiring board in a plane direction.

(7) Other integrated circuit parts and small electrical parts may also be mounted on an area of the terminal density conversion board not already occupied by the mounted integrated circuit part.

(8) The connection package may also include cooling features for the integrated circuit parts.

According to the present invention, it is possible to produce a baseboard with a broader interterminal pitch even if a plurality of circuit elements having different interterminal pitches are mounted thereon. Therefore, baseboard production is simplified and costs reduced. The overall production cost of the printed wiring board mounting multi-chip modules can be significantly reduced.

Furthermore, although a few preferred embodiments of the present invention have been described, it would be appreciated by those skilled in the art that changes may be made in these embodiments without departing from the principles and spirit of the invention, the scope of which is defined in the claims and their equivalents.

What is claimed is:

1. A method for mounting circuit elements onto a printed wiring board, comprising the steps of:

mounting an integrated circuit having terminals with a first interterminal pitch onto a first layer of a terminal density conversion board;

converting the first interterminal pitch of the integrated circuit to terminals with a second interterminal pitch larger than the first interterminal pitch on a second layer of the terminal density conversion board;

mounting the terminals on the second surface of the terminal density conversion board with the second interterminal pitch onto the printed wiring board, and mounting circuit elements having terminals with the second interterminal pitch onto the printed wiring board at locations other than the location at which the terminal density conversion board is mounted onto the printed wiring board.

2. A method for mounting circuit elements onto a printed wiring board, comprising the steps of:

mounting an integrated circuit having terminals with a first interterminal pitch onto a first layer of a terminal density conversion board;

converting the first interterminal pitch of the integrated circuit to terminals with a second interterminal pitch larger than the first interterminal pitch on a second layer of the terminal density conversion board;

mounting the terminals on the second surface of the terminal density conversion board with the second interterminal pitch onto the printed wiring board, and mounting circuit elements having terminals with the second interterminal pitch onto the terminal density conversion board at locations other than the location at which the integrated circuit is mounted onto the terminal density conversion board and at locations other than the location of the terminals on the terminal density conversion board connecting the terminal density conversion board to the printed circuit board.

3. A method for mounting circuit elements onto a printed wiring board, comprising the steps of:

mounting an integrated circuit having terminals with a first interterminal pitch onto a first layer of a terminal density conversion board;

converting the first interterminal pitch of the integrated circuit to terminals with a second interterminal pitch larger than the first interterminal pitch on a second layer of the terminal density conversion board;

mounting the terminals on the second surface of the terminal density conversion board with the second interterminal pitch onto the printed wiring board, and mounting a cooling device onto a surface of the integrated circuit without the terminals connected to the terminal density conversion board.

4. A method for mounting circuit elements onto a printed wiring board, comprising the steps of:

mounting an integrated circuit having terminals with a first interterminal pitch onto a first layer of a terminal density conversion board;

converting the first interterminal pitch of the integrated circuit to terminals with a second interterminal pitch larger than the first interterminal pitch on a second layer of the terminal density conversion board;

mounting the terminals on the second surface of the terminal density conversion board with the second interterminal pitch onto the printed wiring board, and setting a thermal expansion coefficient of the terminal density conversion board to a value between a thermal expansion coefficient of the integrated circuit and a thermal expansion coefficient of the printed wiring board.

* * * * *